United States Patent
Somashekar et al.

(10) Patent No.: US 9,912,316 B1
(45) Date of Patent: Mar. 6, 2018

(54) MECHANICAL HUB

(71) Applicant: Sprint Communications Company L.P., Overland Park, KS (US)

(72) Inventors: Sharath Somashekar, Overland Park, KS (US); Nitesh Manchanda, Overland Park, KS (US); Sreekar Marupaduga, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 0 days.

(21) Appl. No.: 15/057,781

(22) Filed: Mar. 1, 2016

Related U.S. Application Data

(63) Continuation of application No. 14/086,647, filed on Nov. 21, 2013, now Pat. No. 9,318,249.

(51) Int. Cl.
H02G 15/04 (2006.01)
H03H 7/38 (2006.01)

(52) U.S. Cl.
CPC ..................... *H03H 7/38* (2013.01)

(58) Field of Classification Search
CPC ..... H02G 15/04; H02G 15/043; H02G 15/025
USPC ........................................ 174/75 C, 78, 74 R
See application file for complete search history.

(56) References Cited

U.S. PATENT DOCUMENTS

| | | | | |
|---|---|---|---|---|
| 3,579,172 A * | 5/1971 | Clark | ............... | H01R 4/2487 174/87 |
| 6,198,049 B1 * | 3/2001 | Korinek | ............... | B25B 23/1415 174/87 |
| 6,727,430 B1 * | 4/2004 | Franks, Jr. | ............. | H01R 4/643 174/135 |
| 6,910,899 B1 * | 6/2005 | Daume | ................. | F16L 11/127 439/100 |
| 6,914,191 B2 * | 7/2005 | Leith | ........................ | H01R 4/56 174/87 |
| 2010/0190377 A1 * | 7/2010 | Islam | .................... | H01R 9/0527 439/584 |
| 2013/0313015 A1 * | 11/2013 | Citurs | .................. | H01R 13/187 174/363 |

OTHER PUBLICATIONS

Dongjiang Qiao Dongjiang Qiao et al, "Antenna impedance mismatch measurement and correction for adaptive CDMA transceivers", IEEE MTT-S International Microwave Symposium Digest, 2005.

"Minimizing PIM Generation From RF Cables and Connectors: Understanding mechanical tolerances, coaxial design details and connector materials used in cable assemblies helps produce communications equipment with the lowest levels of passive intermodulation (PIM)", San-tron, Inc., Ipswich, MA, Retrieved Nov. 22, 2013. Available at: http://www.santron.com/Documents/PIM%20White%20Paper.pdf.

(Continued)

Primary Examiner — Chau N Nguyen

(57) ABSTRACT

A mechanical hub is provided. The mechanical hub is attachable to a cable and includes an outer shell and tiles. The outer shell surrounds the cable. The tiles are spaced to surround the circumference of the cable. The tiles may be positioned between the outer shell and the cable such that a translation of the outer shell alters the distance between the tiles and the cable. The mechanical hub may improve signals that are transmitted over segments of a cable that have degraded signal quality.

10 Claims, 6 Drawing Sheets

(56) References Cited

OTHER PUBLICATIONS

David Weinstein, "Passive Intermodulation Distortion in Connectors, Cable and Cable Assemblies" Amphenol Corporation, Danbury, CT, Retrieved Nov. 22, 2013. Available at: http://www.ieee.li/pdf/essay/passive_imd.pdf.
Ronnie Rice, "Intermodulation Distortion in RF Connectors", RFP2: RF Precision Products, Retrieved Nov. 22, 2013. Available at: http://www.rfp2.com/pdf/tech-wp-Intermodulation.pdf.
First Action Interview Preinterview Communication dated May 14, 2015 in U.S. Appl. No. 14/086,647, 5 pages.
First Action Interview Office Action dated Sep. 10, 2015 in U.S. Appl. No. 14/086,647, 7 pages.
Notice of Allowance dated Dec. 16, 2015 n U.S. Appl. No. 14/086,647, 7 pages.

\* cited by examiner

600

MECHANICAL HUB

CROSS-REFERENCE TO RELATED APPLICATIONS

This application is a continuation of U.S. patent application Ser. No. 14/086,647, entitled "Mechanical Hub," filed Nov. 21, 2013, which is hereby incorporated by reference in its entirety.

STATEMENT REGARDING FEDERALLY SPONSORED RESEARCH OR DEVELOPMENT

Not applicable.

SUMMARY

Embodiments of the invention are defined by the claims below. Embodiments of the invention may reduce passive intermodulation (PIM) by providing a mechanical hub that is configurable to alter the radius of tiles near the transmission cable. The change in distance between the cable and tiles alters the impedance at the cable. This change in inductance and capacitance may improve the signals that are transmitted through the cable. Embodiments of the invention have several practical applications in the technical arts including providing a low-cost mechanism to improve or lengthen the life of a cable without requiring immediate removal from the computing system or communication network.

In a first aspect, a mechanical hub is installed on a cable (e.g., radio frequency cable) to reduce impedance mismatch. The hub surrounds the cable and is configured to vary capacitance and inductance, which may correct mismatches in impedance. The hub may be removed or attached to the cable along different segments (rusted or corroded parts) to improve signal transmission along those portions of the cable.

The mechanical hub may have a tightening element that alters the distance between the elements of the hub and the cable. In one embodiment, the tightening element of the hub may include screws. In an alternate embodiment, the tightening element of the hub may be a helix configuration that tightens in response to a technician twisting the exterior shell of the hub.

Upon tightening of the screws or helix of the hub, a distance between conducting materials in one or more metallic tiles and the cable changes. This change in distance may tune the hub to remove detected impedance mismatches in the cable. The hub may be covered to protect the cable from externalities (e.g., weather or mechanical wear).

BRIEF DESCRIPTION OF THE SEVERAL VIEWS OF THE DRAWINGS

Illustrative embodiments of the invention are described in detail below with reference to the attached drawing figures, which are incorporated by reference herein and wherein.

DETAILED DESCRIPTION

Embodiments of the invention provide systems and methods for a mechanical hub that is attached to a transmission cable. Because the cables may have varying properties that become apparent in response to environmental aging and material degradation, the mechanical hub may be attached to a cable to offset the effects of this aging and material degradation. The mechanical hub offers a solution that goes beyond matched circuits or corrosion-resistant materials. As time passes, oxidation takes its toll on all circuits, connectors, cables, etc., and increases inherent non-linear effects such as corona generation, current saturation, and PIM. PIM may be caused by the chemical alteration and physical changes in materials over time. Accordingly, radio connectors and signal transmission degrade unless a technician monitors and fixes or replaces them.

The configurable mechanical hub provides a means for extending the life of a transmission cable (e.g., RF cable, coaxial cable, or tower cable) without requiring immediate replacement of affected materials. In one embodiment, a hub is attached to either end of the cable. In another embodiment, the hub is attached to both ends of the cable. This hub allows a technician or network operator to manage PIM in the cables.

The network operators or technician may monitor currents or voltage in the cable. In response to observed current or voltage degradation, the operators or technician may manipulate a mechanical hub attached to the cable to improve transmission. For instance, impedance matching may be controlled by altering the tile distances. The tile distances are changed by tightening the hub around the cable.

The hub in one embodiment may be part of the cable. The hub can be manufactured as part of the cable. Alternatively, the hub may be installed after the cable degrades. The technician may install the hub on the cable by unsheathing the exterior wire to expose the conductor and clamping or attaching the hub around the cable.

Figure 1:
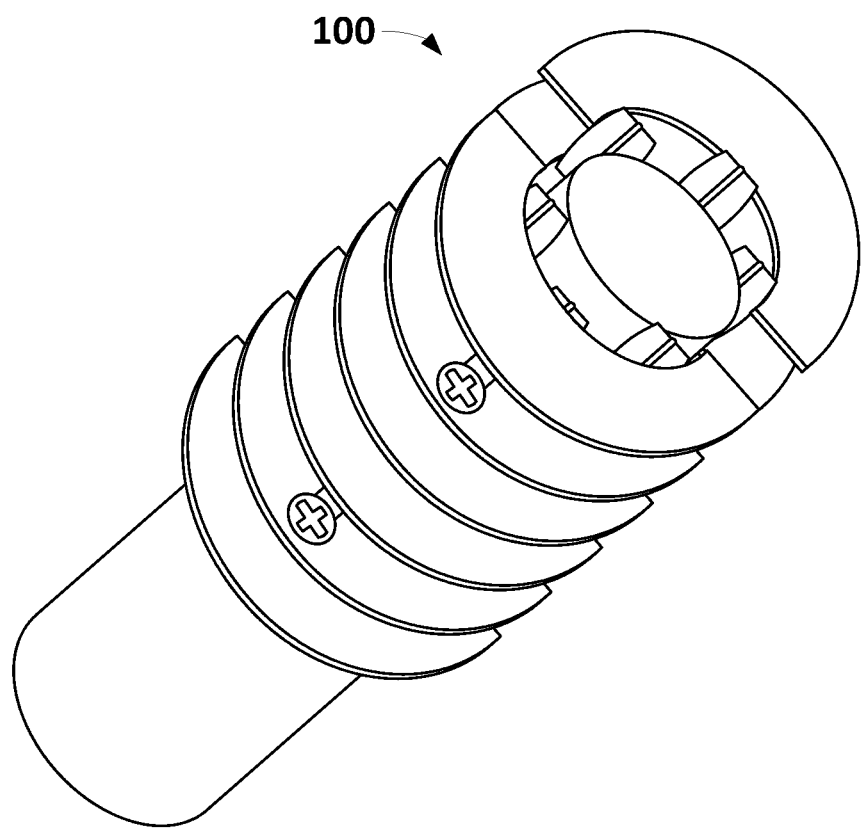
FIG. 1 is a three-dimensional view of the mechanical hub, according to embodiments of the invention.

FIG. 1 is a three-dimensional view 100 of the mechanical hub, according to embodiments of the invention. The mechanical hub 100 is cylindrical and completely surrounds the cable. The shape of the mechanical hub is a design choice. A manufacturer may choose to change the shape of the mechanical hub 100 to a square, oval, or any parallelogram that may completely surround the cable.

The mechanical hub 100 may be manufactured as part of a cable or the mechanical hub 100 may be attached to a cable after the cable begins to degrade. The mechanical hub 100 is configurable to improve the transmissions along the cable. The mechanical hub 100 is sized to fit any cable. The size of the mechanical hub 100 is proportional to the size of the cable that the mechanical hub is attached to. The larger the cable, the larger the mechanical hub. The mechanical hub 100 is sized to completely surround the cable.

In some embodiments, the mechanical hub 100 may contain tile/plates. The ceramic chips are to tune the signals transmitted over the cable. The tiles may be distributed between an outer shell of the mechanical hub and the cable. The tiles may include a gold conductor that is moveable to increase or decrease a distance between the ceramic chip and the cable. Accordingly, the mechanical hub 100 is configured to manage the PIM dissipation experienced at a cable.

The outer shell of the mechanical hub may connect to the tiles with screws. A technician may tighten the screws that connect the tile to the mechanical hub. Tightening the screws alters the distance between the tiles and the cable. As the distance increases or decreases, in some embodiments, the technician may observe an improvement in the signal that is transmitted through the cable.

Figure 2:
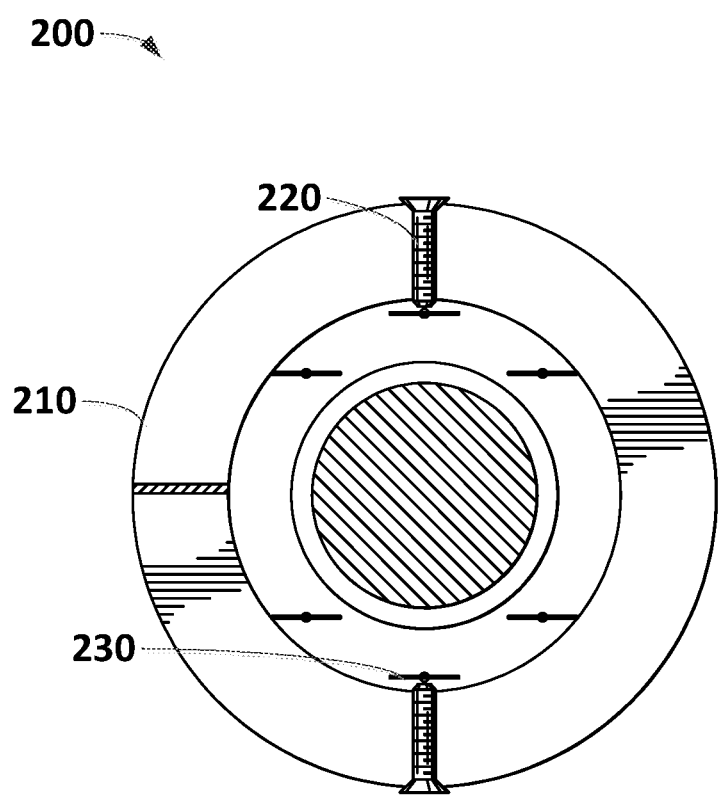
FIG. 2 is a top view of the mechanical hub, according to embodiments of the invention.

FIG. 2 is a top view 200 of the mechanical hub, according to embodiments of the invention. The mechanical hub 200 may include an outer shell 210 that protects the cable (e.g., coaxial cable, RF cable, tower cables). The screws 220 may be used to alter the distance a tile 230 is from the cable (the conductor of the cable). The screws 220 may be flathead screws or star screws. Each screw may anchor a tile 230 to the outer shell 210 of the mechanical hub 200.

The tile 230 may be metallic tiles that alter the signals that pass through the cable. In one embodiment, the tile may be composed of gold tiles. In other embodiments, the tile may be composed of any material with high conductivity. The tiles 230 may vary in shape or size. The tiles 230 may be rectangular, circular, or any shape that will improve the signal that transmitted through the cable. The size of the tile 230 is also variable. The size of each tile may be uniformly or randomly distributed. In one embodiment, the size of ceramic may be ten percent of the size of the cable. For instance, the tiles may range between 1 and 10 centimeters.

The tiles 230 are moveable in response to loosening or tightening the screws 220. In one embodiment, the tiles 230 may move backward and forward to increase or decrease the distance between the tiles and the cables. In other embodiments, the tiles 230 may tilt on an angle toward or away from the cable. As the tiles move farther away from, or closer to, the cable, the signal properties may change. A technician may observe the changes in the signal as the distances change. The technician may use a spectrometer, voltmeter, or ammeter to measure the signal across the cable.

Accordingly, in operation the mechanical hub has many ceramic chips that may be used to match the load impedance of the cable. The cable load impedance may vary due to wear and tear. The mechanical hub may offset the load impedance. The mechanical hub may cause maximum power transfer to occur and reduce power loss at the cable.

In some embodiments, the mechanical hub is clamped to the cable. The mechanical hub may have a clamp that connects the mechanical hub to the cable. The clamp may be a nonconductive material (e.g., plastic). Accordingly, for cables that are not manufactured with the mechanical hub, a technician may install the mechanical hub via the clamp.

Figure 3:
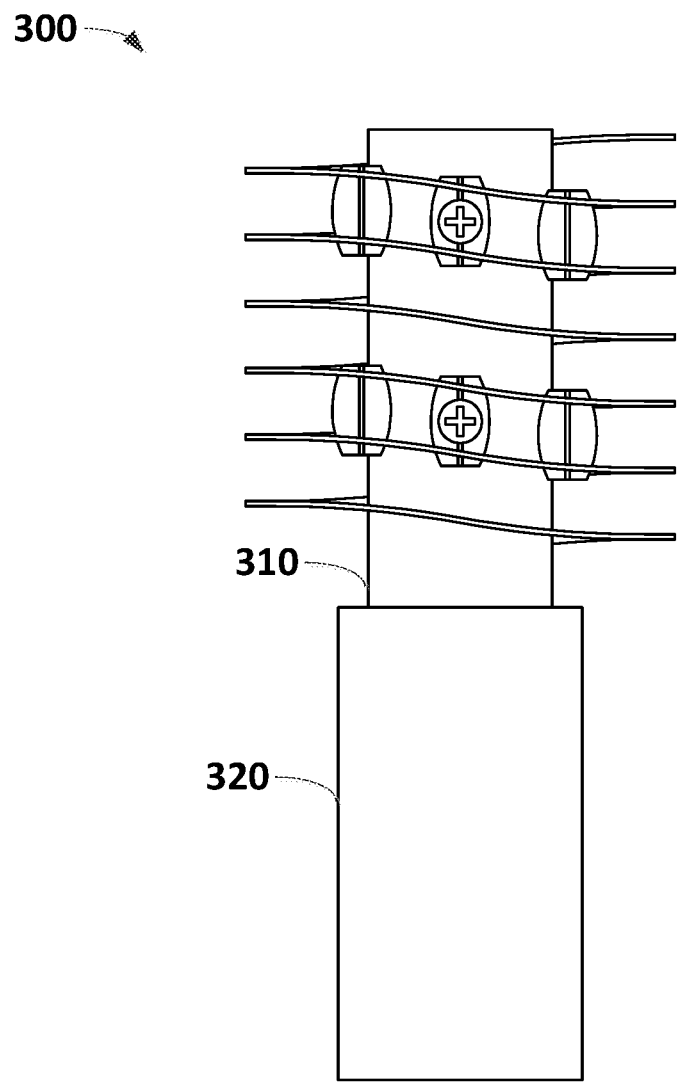
FIG. 3 is a side view of the mechanical hub, according to embodiments of the invention.

FIG. 3 is a side view 300 of the mechanical hub, according to embodiments of the invention. The mechanical hub may surround a cable 310. The mechanical hub may be connected to the cable 310 via a clamp 320. The clamp 320 secures the mechanical hub to the cable 310.

The clamp 320 is composed of nonconductive material. In one embodiment, the clamp 320 is composed of a plastic material. In an RF cable, the plastic clamp 320 may be installed at the junction on the RF cable and the RF connectors. For instance, the plastic clamp 320 may be installed before the RF connectors. The clamp 320 may be installed anywhere along the cable that has corroded or degraded over time. Once the clamp 320 is installed, the technician may alter the distances of the tiles to improve the signal produced by the cable.

As mentioned above, the position of the clamp 320 for the mechanical hub may vary depending on the type of cable. In some embodiments, a cable designer may choose to integrate the mechanical hub with the cable at time of manufacture. The cable designer may select predefined positions along the cable to provide seamless access to the mechanical hub. In other embodiments, a cable technician may install the clamp 320 of a mechanical hub to tower cables that have degraded over time. The cable technician may install the mechanical hub at the degraded locations of the cable.

Accordingly, the plastic clamp 320 secures the mechanical hub to the cable. In some embodiments, the plastic clamp may also provide weather or mechanical protection for the mechanical hub. In other embodiments, a technician does not need to install the mechanical hub because it may be integrated as part of the cable during the fabrication and production of the cable.

A technician may monitor segments of a cable to determine whether signal degradation occurs over particular segments. In some embodiments, when a segment of the cable is identified as degraded or corroded, the technician may decide to alter the tiles of the mechanical hub. The signal transmitted through the cable may improve based on the changes in position of the tiles. When the technician observes the improvement in the signal, the technician stops altering the tiles.

Figure 4:
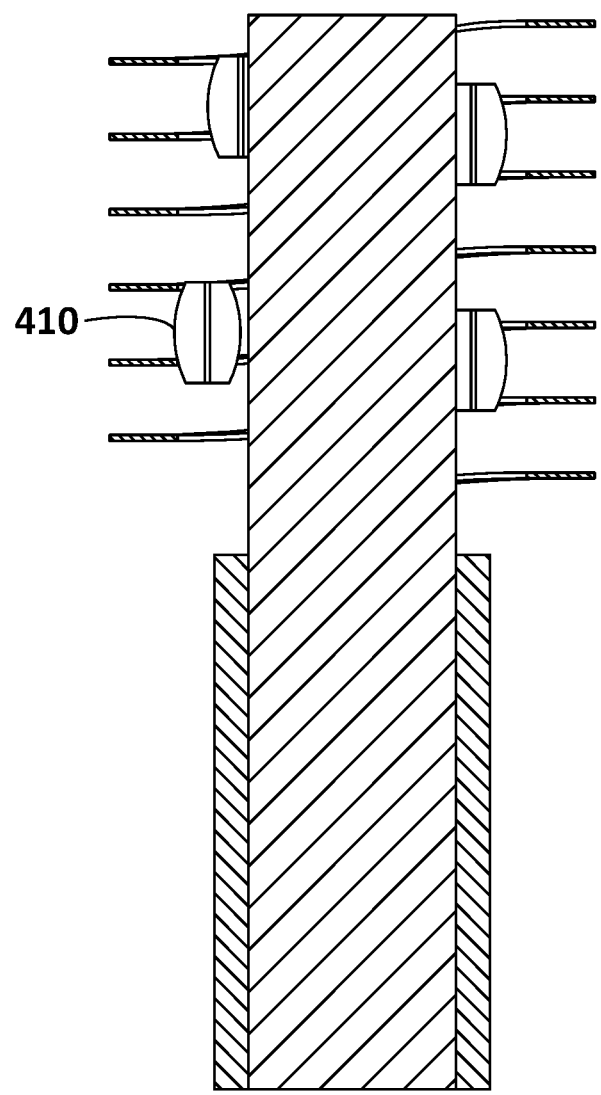
FIG. 4 is a cross-sectional view of the mechanical hub, according to embodiments of the invention.

FIG. 4 is a cross-sectional view 400 of the mechanical hub, according to embodiments of the invention. The mechanical hub clamps to the unsheathed wire 410 of the cable. The unsheathed wire 410 exposes the conducting elements of the cable. In certain embodiments, a monitor may be attached to the exposed conducting elements to measure signal attributes. For instance, the monitor may measure voltage or currents across a segment of cable.

In one embodiment, a segment of cable is selected for repair based on a visual inspection that shows evidence of wear and tear or corrosion. In other embodiments, the monitored signal may provide an indication that repairs are necessary when the signal quality degrades below a specified threshold. The indication may be the power, current, voltage, signal-to-noise ratio, reference signal received power (RSRP), or reference signal received quality (RSRQ) that is observed by the technician. When the values for the indicators fall below specified thresholds, the technician may attempt to repair the cable using the mechanical hub. The technician may use the mechanical hub to repair the segment of cable that has corroded. Or, the mechanical hub may be used to improve the signal that is shown as degraded in the monitor.

The mechanical hub may be manufactured with cylindrical sections that surround the conductor. In some embodiments, the distance between these cylindrical sections and the conductor may be altered manually by the technician until the impedance is matched. Capacitance may be varied by moving the sheet in a direction perpendicular to the plane of the load line. Inductance may be varied by displacement of the sheet along the plane of the load line. In some embodiments, the capacitance may be calculated by $$\frac{\varepsilon A}{\Delta},$$

where $\varepsilon$ is the dielectric constant, A is the area overlap between cable and tiles, and $\Delta$ is the distance between the tiles and the plates.

The displacement (vertical or horizontal) may be controlled by a tightening element located on the exteriors of the mechanical hub. The tightening element may be a screw or helix that displaces the cylindrical sections and tiles of the mechanical hub. The cylindrical sections or tiles, in one embodiment, may be independently varied to match impedance based on a detected mismatch that degrades signal quality. Also, the tiles in each section may have different shapes or sizes.

Figure 5:
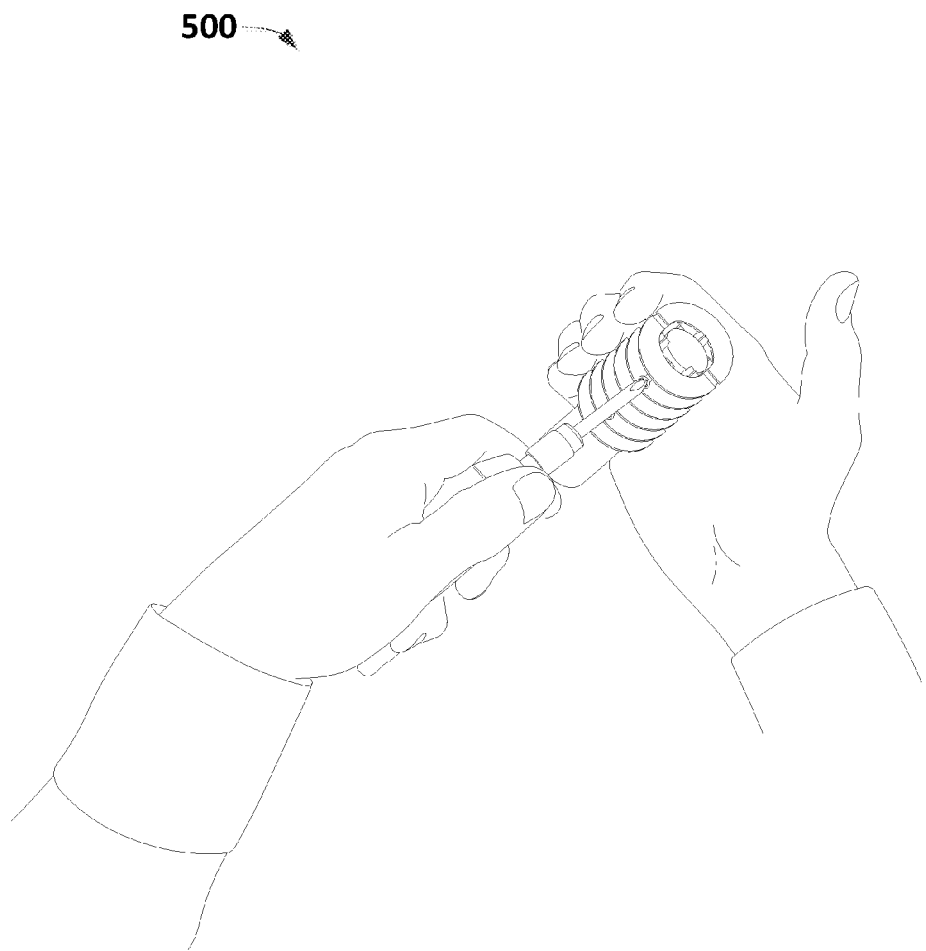
FIG. 5 is a view of the mechanical hub being engaged with a screwdriver to alter the radius of the hub, according to embodiments of the invention.

FIG. 5 is a view 500 of the mechanical hub being engaged with a screwdriver to alter the radius of the hub, according to embodiments of the invention. The screws of the mechanical hub may be tightened or untightened to change the distance that the tiles are from the cable.

The mechanical hub is attachable to a cable. The mechanical hub includes an outer shell and tiles. The outer shell of the mechanical hub surrounds a cable. The tiles are spaced to surround the circumference of the cable. The tiles may float around the cable or the tiles may touch the cable. The screws connect the tiles to the outer shell. The screws are translatable to alter the distance between the tiles and the cable. The screws are also translatable to alter the location of the tiles along a plane that is parallel to the cable. In certain embodiments, altering the distance or location, changes the characteristics of the signals that are transmitted on the cable. For instance, the capacitance and inductance of the cable may be changed to improve signal quality when the technician tightens or loosens the screws. The technician may use a screwdriver to tighten or loosen the screw. The screws are translated with a screwdriver.

The cable is any cable that transmits a signal. For instance, the cable may be selected from either a communication cable or a power cable. The mechanical hub is removable from the cable, in one embodiment, by releasing a clamp that attaches to the mechanical hub.

In other embodiments, the mechanical hub may be manipulated using a screwdriver. A technician may use a hand to attach or remove the mechanical hub from the cable. The outer shell of the mechanical hub may be a helix structure that is turnable to loosen or tighten the mechanical hub.

Figure 6:
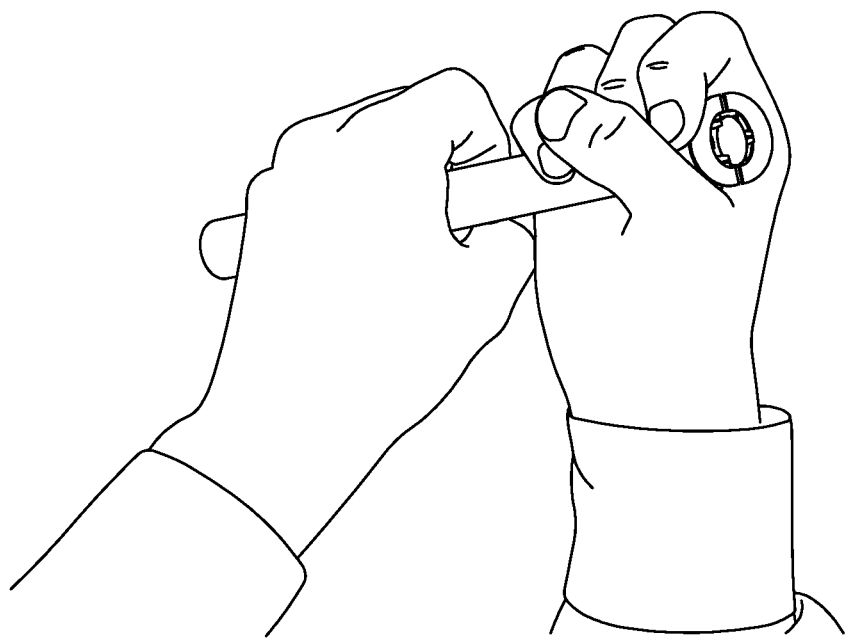
FIG. 6 is a view of the mechanical hub being engaged with a hand turn to alter the radius of the mechanical hub, according to embodiments of the invention.

FIG. 6 is a view 600 of the mechanical hub being engaged with a hand turn to alter the radius of the mechanical hub, according to embodiments of the invention. A turn on the outer shell of the mechanical hub by the technician may alter the distance or location of the tiles.

As explained above, the mechanical hub is attachable to a cable and includes an outer shell and tiles. The outer shell is turnable and surrounds the cable. The tiles are spaced to surround the circumference of the cable. In some embodiments, the tiles do not touch the cable. The tiles are placed between the cable and the outer shell. In one embodiment, a rotation of the outer shell may alter the distance the tiles are from the cable. In other embodiments, the rotation of the outer shell may alter the position of the tiles along a plane parallel to the cable. The outer shell may be rotated with a hand turn. In one embodiment, the outer shell may be a helix that changes distance in response to one or more hand turns.

In other embodiments, the rotatable outer shell may also include screws that connect some tiles. For instance, the screws may be used to alter distance of the tiles while the rotation may be used to alter position of other tiles. Alternatively, the screws may be used to alter position along the plane parallel to the cable while the rotation of the outer shell alters the distance between the tiles and cable.

In response to the rotation of the outer shell or manipulation of the screws, the technician may observe a change in the characteristics of the signals that are transmitted on the cable. The inductance of the cable may be altered when the outer shell is rotated or when the screws are manipulated, in at least one embodiment.

The cable may take on many forms. The cable may be either a communication cable or a power cable. The mechanical hub is configured to be removable and attachable to any type of cable that experiences degraded signals.

In summary, a mechanical hub is configured to attach to a cable experiencing problems. The cable may have degraded over time and may transmit signals that suffer from passive intermodulation. A technician may observe the degraded signals over one or more segments of the cable. In response, the technician may attach the mechanical hub to improve the quality of the signal that is transmitted over the cable.

Many different arrangements of the various components depicted, as well as components not shown, are possible without departing from the spirit and scope of the embodiments of the invention. The embodiments have been described with the intent to be illustrative rather than restrictive. Alternative embodiments that do not depart from the scope of the embodiments of the invention will become apparent to those skilled in the art. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

The invention claimed is:

1. A removable mechanical hub for a cable, comprising:
an outer shell;
a conducting material coupled to the outer shell, wherein the conducting material comprises one or more metallic tiles; and
a tightening element comprising one or more screws coupled to the outer shell and to the conducting material,
the one or more screws adjustable to change a distance between the conducting material and the cable,
wherein the outer shell comprises a helix configuration that is rotatable for tightening or loosening the mechanical hub against the cable.

2. The mechanical hub of claim 1, wherein adjusting the distance between the conducting material and the cable modifies an inductance of the cable.

3. The mechanical hub of claim 1, wherein the cable is a communication cable.

4. The mechanical hub of claim 1, wherein the cable is a power cable.

5. A method for improving signal transmission, the method comprising:
attaching a removable mechanical hub to a cable, the removable mechanical hub comprising:
an outer shell,
a conducting material coupled to the outer shell, and
a tightening element comprising one or more screws coupled to the outer shell and to the conducting material,
wherein the one or more screws are adjustable to change a distance between the conducting material and the cable;

adjusting the one or more screws to change the distance between the conducting material and the cable; and twisting the outer shell of the removable mechanical hub to tighten the outer shell against the cable to modify at least one signal characteristic of the cable.

6. The method of claim 5, wherein changing the distance between the conducting material and the cable changes the inductance of the cable.

7. The method of claim 5, wherein the conducting material comprises one or more metallic tiles.

8. The method of claim 7, wherein the one or more metallic tiles comprise a plurality of metallic tiles coupled circumferentially about the outer shell.

9. The method of claim 5, wherein the cable is a communication cable.

10. The method of claim 5, wherein the cable is a power cable.

* * * * *